US006265120B1

(12) United States Patent
Huang

(10) Patent No.: US 6,265,120 B1
(45) Date of Patent: Jul. 24, 2001

(54) GEOMETRY DESIGN OF ACTIVE REGION TO IMPROVE JUNCTION BREAKDOWN AND FIELD ISOLATION IN STI PROCESS

(75) Inventor: Jenn Ming Huang, Hsin-chu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/495,343

(22) Filed: Feb. 1, 2000

(51) Int. Cl.⁷ .................................. G03F 9/00; G03C 5/00
(52) U.S. Cl. ............................ 430/30; 430/311; 430/325; 430/326
(58) Field of Search .............................. 430/30, 311, 325, 430/326

(56) References Cited

U.S. PATENT DOCUMENTS

| | | | |
|---|---|---|---|
| 5,057,462 | 10/1991 | Eisenberg et al. | 437/229 |
| 5,375,157 | 12/1994 | Maehara | 378/35 |
| 5,432,714 | 7/1995 | Chung et al. | 364/525 |
| 5,498,579 | 3/1996 | Borodovsky et al. | 437/250 |
| 5,553,273 | 9/1996 | Liebmann | 395/500 |
| 5,567,553 | 10/1996 | Hsu et al. | 430/5 |
| 5,766,806 | 6/1998 | Spence | 430/5 |
| 5,858,591 | 1/1999 | Lin et al. | 430/30 |

*Primary Examiner*—Christopher G. Young
(74) *Attorney, Agent, or Firm*—George O. Saile; Stephen B. Ackerman

(57) ABSTRACT

The invention teaches a new method that achieves improvements in the creation of shallow Trench Isolation regions. This improvement is achieved by modifying the mask that is used to create the Shallow Trench Isolation regions. The data file that contains the full description of the photoresist image of Shallow Trench Isolation regions, including Optical Corrections, is subdivided into two files. One of the two files contains the descriptions of Shallow Trench Isolation regions that are arranged in array form, the other file contains the descriptions of Shallow Trench Isolation regions that are arranged as single cells. A suitable bias in the form of a small increase or a small decrease is applied to all of the dimensions that are contained within the files. The two files are merged after which conventional processing proceeds.

15 Claims, 2 Drawing Sheets

GEOMETRY DESIGN OF ACTIVE REGION TO IMPROVE JUNCTION BREAKDOWN AND FIELD ISOLATION IN STI PROCESS

BACKGROUND OF THE INVENTION (1) Field of the Invention

The invention relates to the fabrication of integrated circuit devices, and more particularly, to a method of improving the profile of Shallow Trench Isolation regions.

(2) Description of the Prior Art

One of the major disciplines that is used for the creation of semiconductor devices is the art of photolithography. Photolithography is used to create patterns of various designs in semiconductor surfaces. An UV or DUV light source is used to project the image of a mask onto a target surface. The target surface typically is a layer of photoresist, the mask that is used between the light source and the target surface contains regions of total light transparency and regions that block all light from passing through the mask. This latter characteristics results in energy (from the light source) being transmitted into the target surface which changes the chemical and molecular properties of the target surface. Photolithography provides a system of one or more optical lenses through which the light passes before striking the target surface. These lenses have as design objective to create the perfect reflection of the image that is contained in the mask onto the surface that is exposed by the light source. Light of the energy source is transmitted to the target surface as waves of a particular frequency, amplitude and phase and as such is subjected to the laws of physics in its passage from source to target. Ideally all the light that strikes the target surface does so under the exact same conditions of frequency, amplitude, phase and angle of impact so that the image that is created in the target surface is uniform across that surface. A serious problem in this respect of the effect of optical diffraction whereby the light that impacts a surface does so under an angle that varies across the target surface. This effect becomes particularly severe where devices are created of micron or sub-micron dimensions, whereby any deviation from an ideal geometry of the created device features has a relatively larger impact. Reduced device feature size also brings with it the requirement for improved image resolution since the adjacency between device features across the surface of a semiconductor surface is likely to decrease with decreasing device feature size. The resolution of the created image on a target surface is essentially determined by the optimum available numerical aperture of the lens system that is used for the image formation. Improving this performance parameter however is in conflict with the desire to achieve optimum depth of focus of the exposed image since the depth of focus of a lens system is inversely proportional with the numerical aperture of the lens system. To provide the required ideal image in a target surface, a number of corrective measures can be used that offset the undesirable characteristics of the system that is used to create this image. These corrective measures can make use of any or a combination of the parameters that play a role in the creation of the ideal image and that essentially already have been highlighted as light amplitude, frequency and phase. In addition, the method in which the image is created can be changed by for instance "predistorting" the image, that is creating an image before the process of exposure occurs that, when the distorting effects of the image formation are taken into account, forms an ideal image on the target surface or at least an image that is as close as possible to the ideal image. It is clear that these corrective measures are highly image dependent in the sense that, across the surface of a relatively large wafer, effects that are applied to the center of the wafer surface may have an entirely different effect at the perimeter of the wafer.

Light diffraction is the modification of light as it passes through opaque surfaces or through narrow slits and in which the light appears to be deflected and produces fringes of parallel light and dark or colored bands of light. The impact that light diffraction has on image formation where the images are of extremely small dimensions (0.5 microns or less) is therefore readily apparent in that light that is meant for a particular (small) areas readily "spills over" in an immediately adjacent (and equally small) area thus preventing sharp definitions of the two adjacent areas.

Phase control of the light that is used to create an image can be implemented by making use of the fact that the phase of the light that exits a surface (such as a photo lithographic mask) can be made to relate to the phase of the light as it enters this surface whereby the parameter of control in adjusting this phase relationship is the thickness of the surface through which the light travels. By varying the thickness of the surface through which the light passes (that is having a surface that is not of uniform thickness) the phase of the light can be changed and therefore the amplitude of the light that exits the surface can be controlled (across the surface of for instance a photolithographic mask). The image that is created in this manner can therefore be adjusted or manipulated to compensate for any negative effects that are present in the imaging system. This latter approach may appear to be complex and difficult to implement were it not for the fact that most image processing systems are highly automated and are computerized to a large extend. The design parameters that affect ultimate image qualities can therefore readily be entered into a computer system where they become part of the appropriate support software and can change imaging rules and behavior for optimum results. A computer based design system also lends itself well to implementing requirements of mask exposure over relatively large surfaces and to make exposures that are dependent on the location within a large surface. This latter capability must be considered a basic requirement for any such automated or computer aided design system since most semiconductor devices are produced using large wafers and are mass produced whereby multiple device features are simultaneously created as part of one exposure sequence.

The process of the invention is aimed at creating Shallow Trench Isolation (STI) regions in a semiconductor surface. STI regions are typically used in creating Field Effect Transistor (FET's) to reduce or eliminate leakage currents between or around the periphery of these devices.

In using the STI approach for the VLSI technology, deep trenches are typically made in the substrate by reactive ion etching. The trenches are typically about 5–6 um. deep, about 2–3 um. wide and spaced about 2.5.–3.5 um. apart from another trench. The ULSI technology requires trenches that are deeper and spaced closer together posing new problems of field turn-on, punchthrough, gap-fill within the trenches and others.

STI's can be made using a variety of methods. For instance, one method is the Buried Oxide (BOX) isolation used for shallow trenches. The method involves filling the trenches with a chemical vapor deposition (CVD) silicon oxide ($SiO_2$) and then etched back or mechanically or chemically polished to yield a planar surface. The shallow trenches etched for the BOX process are anisotropically plasma etched into the silicon substrate and are typically between 0.5 and 0.8 micrometer (um.) deep. STI are formed around the active device to a depth between 4000 and 20000 Angstrom.

Another approach in forming STI's is to deposit silicon nitride on thermally grown oxide. After deposition of the nitride, a shallow trench is etched into the substrate using a mask. A layer of oxide is then deposited into the trench so that the trench forms an area of insulate dielectric which acts to isolate the devices in a chip and thus reduce the cross talk between active devices. The excess deposited oxide must be polished off and the trench planarized to prepare for the next level of metalization. The silicon nitride is provided to the silicon to prevent polishing of the masked silicon oxide of the device.

While the dielectric-filled trench isolation can provide effective dielectric isolation between devices, it remains a key requirement of the creation of STI regions that the geometry of the STI remains uniform across the surface in which they are created. Lack of uniform geometry of the STI region may result in a structure that tends to be non-planar. This lack of planarity is mainly due to the difference in the amount of fill that is required to fill a multiplicity of closely spaced trenches and the dielectric that is deposited on the surface of the substrate. This effect is further aggravated by the steps of bake and cure that are applied to the deposited dielectric in order to cure the dielectric and to evaporate the solvents from the dielectric. Further problems can be caused in this respect by the fact that in many chip designs there can be a significant difference in device density across the chip. In the design of memory chips for instance, the memory functions of the chip can consist of 10.000 or more memory elements. These memory elements are surrounded by their supporting logic functions which tend to have considerably lower density of active elements thereby further aggravating the problems of even distribution of the deposited dielectric across the surface of the chip and of obtaining good planarization for the entire surface of the chip. It is clear that poor planarity across the surface of the trenches leads to further problems in creating interconnect patterns and in depositing overlying layers of insulation and metalization. These overlying layers of metalization must be patterned and etched, a typically photolithographic process that requires constant and low depth of focus. Where this depth of focus is not as required, wire patterns of poor quality are created resulting a serious yield detractors and concerns of device reliability.

Another problem associated with the formation of STI regions is that, where these STI regions do not have a uniform geometry over the surface of the wafer, if the silicon oxide is etched or polished to the surface of the silicon substrate, dishing occurs in the surface of the silicon oxide resulting in a concave surface of the STI regions. This results in recesses in the field oxide at the edge of the device areas. Later, when the gate electrodes are made for the FET's, the gate electrodes extend over the device area edge, causing an undesirable lower and variable threshold voltage when the devices are completed. It is therefore desirable to make isolation areas that avoid this problem by providing STI's with uniform geometries.

FIG. 1 shows a cross section of an STI region that has well defined edges around the perimeter of the STI region due to a good profile of the STI. An STI region with this profile will perform well with respect to leakage currents and breakdown voltage.

FIG. 2 shows a cross section of an STI region that has poorly defined edges around the perimeter of the STI region due to a poor profile of the STI. An STI region with this profile will perform not well with respect to leakage currents and breakdown voltage.

Various approaches have been taken in the prior art to deal with the proximity effect. Eisenberg et al (U.S. Pat. No. 5,057,462 dated October 1991) examines the results of a first pass attempt and then modify the etching and resist parameters accordingly. Borodovsky et al. (U.S. Pat. No. 5,498,579, dated March 1996) use two masks, the second one serving to compensate for proximity effects introduced by the first one. Liebmann (U.S. Pat. No. 5,553,273, dated September 1996) sorts a design into small areas according to shape and width and those areas that are identified as gate regions are biased based on applicable OPC rules. Maehara (U.S. Pat. No. 5,375,157, dated December 1994) teaches the manufacture of a distortion free mask for X-ray lithography. Chung et al. (U.S. Pat. No. 5,432,714, dated July 1995) shows how accumulated information on exposure can be used during electron beam lithography to compensate for proximity effects. Further Prior Art patents are listed below.

U.S. Pat. No. 5,567,553 (Hsu et al.) shows a method to reduce leakage due to sharp isolation corners (OD).

U.S. Pat. No. 5,766,806 (Spence) teaches an optical lithography using PSM.

U.S. Pat. No. 5,858,591 (Lin et al.) shows an OPC through subfile bias modification with subsequent subfile merging.

The process of the invention is aimed at the existing problem of lack of uniformity of the STI geometry across the surface of the substrate in which the STI regions are formed.

SUMMARY OF THE INVENTION

A principle objective of the invention is to provide a method of creating STI regions that are of uniform geometry across a semiconductor surface.

Another objective of the invention is to provide a method that allows for reduced spacing between adjacent STI regions.

Another objective of the invention is to provide a method of creating a high aspect ratio STI regions across a semiconductor surface while avoiding problems of gap fill and the occurrence of voids within the gap.

Yet another objective of the invention is to improve STI punchthrough immunity.

Yet another objective of the invention is to reduce junction leakage around the periphery of STI regions.

Yet another objective of the invention is to improve STI field turn-on/turn-off characteristics.

Yet another objective of the invention is to increase the STI junction breakdown voltage value.

In accordance with the objectives of the invention a new method is provided to create STI regions. The invention provides a method for the creation of STI regions across the surface of a semiconductor that are of uniform geometry. The data base that contains mask fabrication information that relates to STI exposure is pre-processed with the objective of enlarging the corners in the mask for exposed STI regions thereby elimination non-uniform STI profiles and assuring uniform STI profiles across the surfaces in which STI regions are created.

In accordance with the objective of the invention, a new method is provided that achieves improvements in the creation of shallow Trench Isolation regions. This improvement is achieved by modifying the mask that is used to create the Shallow Trench Isolation regions. The data file that contains the full description of the photoresist image of Shallow Trench Isolation regions, including Optical Corrections, is subdivided into two files. One of the two files contains the descriptions of Shallow Trench Isolation regions that are arranged in array form, the other file contains the descriptions of Shallow Trench Isolation regions that are arranged as single cells. A suitable bias in the form of a small increase or a small decrease is applied to all of the dimensions that are contained within the files. The two files are merged after which conventional processing proceeds.

DESCRIPTION OF THE PREFERRED EMBODIMENTS

The above indicated defects in projecting ideal contours of an image are more of a problem where device features and distances between adjacent lines are in the micron or sub-micron range. This is referred to as the proximity effect whereby it becomes increasingly more difficult to clearly project and differentiate between adjacent lines. Interference of the projection of adjacent lines causes poor delineation of closely spaced lines. To compensate for the proximity effect, feature sizes can be modified thereby aimed to negate the proximity effect. For instance, if a line is projected that is too wide, the line can be projected undersized of the required width. The resulting line that is created will in this manner closely approach the desired width. This corrective effort can be implemented by modifying the data that is used to create the mask for the lines. Exposure masks are created under computer control using data files that contain the mask data. By changing these data files, the corrected or adjusted masks can be created. By applying these corrected masks in exposing the desired lines, an underexposure in line width can in this manner result in the desired line width.

In the process of forming an array of STI regions across the surface of a relatively large semiconductor wafer, it is difficult to create images of the STI that are the same at the periphery of the wafer and at the center of the wafer. The largest distortion is likely to occur towards the periphery of the wafer. This phenomenon is demonstrated using FIG. 3.

Figure 1:
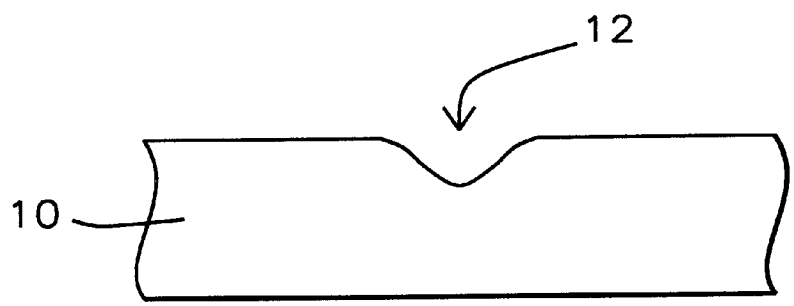
FIG. 1 shows a cross section of a STI region that has well defined edges.
Figure 2:
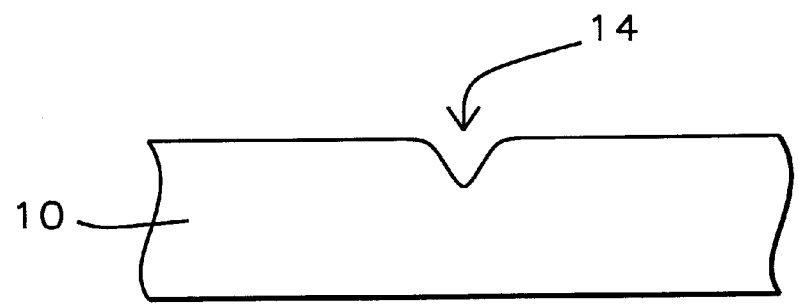
FIG. 2 shows a cross section of a STI region that has poorly defined edges.
Figure 3A:
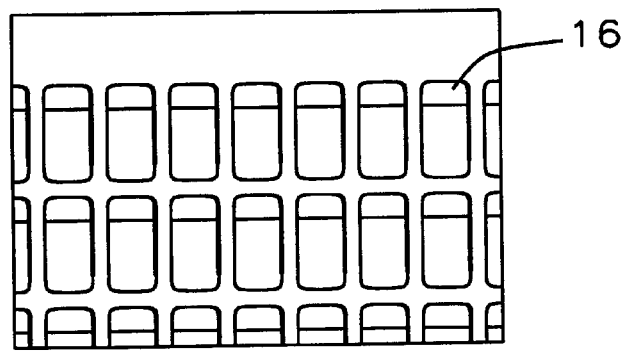
FIG. 3 shows a top view of an array of STI areas across the surface of a semiconductor wafer.

FIG. 3a shows a top view of an array of STI regions that is located at the top of the array. Each of the profiles of the STI regions is, ideally, supposed to have a uniform profile with sides 16 around the perimeter of the STI region that are of equal width along this perimeter. It is clear from FIG. 3 that this is not the case for the part of the STI array that forms the top of the arrays across a wafer surface. The poor STI profile that is shown in FIG. 3 is caused by silicon etching during the STI process. By looking at STI region 16 for instance, it can be seen that the top and right hand side of this STI region are considerably thicker than the left and the bottom sides of the STI region. This leads to a profile that has been indicated in FIG. 2, which in turn leads to poor functional performance of the STI region. The objective of the invention is to prevent this kind of profile. The invention compensates for the distortions that are caused during silicon processing through optical correction by means of mask pre-distortion. The method of the invention is therefore not to be confused with the so called Optical Proximity correction (OPC).

Figure 3B:
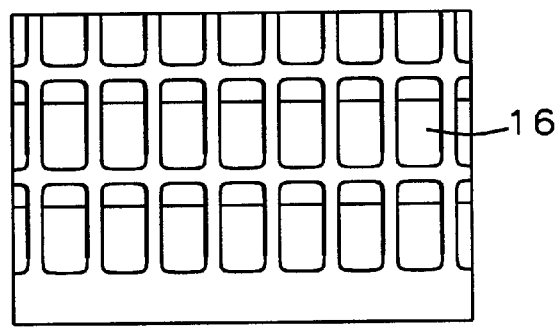

FIG. 3b shows a sampling of profiles of STI's that have been created at the bottom of the array. The same phenomenon that have previously been described under FIG. 3a can be observed in FIG. 3b.

Figure 4A:
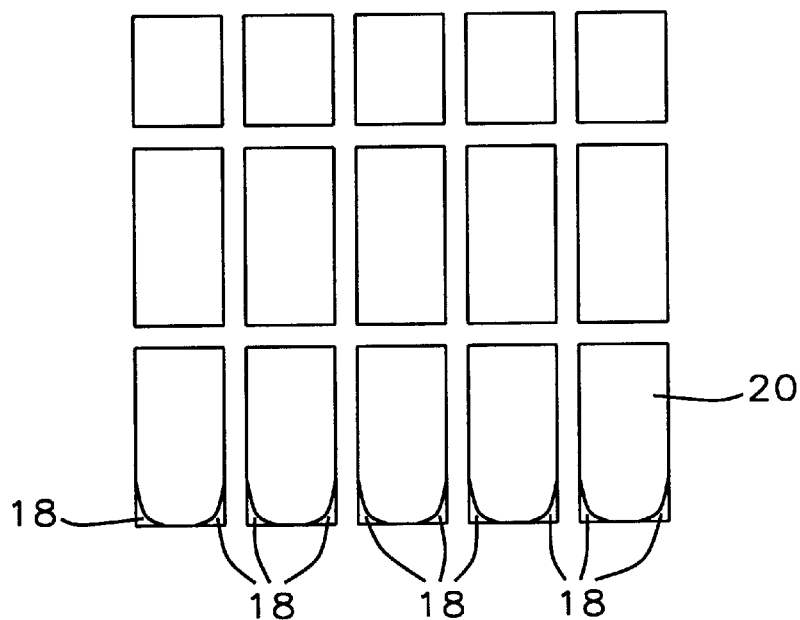
FIG. 4 shows a top view of target images of STI regions of the invention.

The method of the invention to achieve this objective is highlighted using FIG. 4. The top view of the STI profiles that is shown in FIG. 4 is shown to indicate that the profiles of the STI regions are pre-distorted in a controlled manner such that, when these profiles are projected and created in the surface of a semiconductor wafer the error that are can be contributed to systemic errors of the projection system are cancelled out. The image that is shown in FIG. 4 is not, if it were to be created without distortion or the introduction of errors, the image that should be created for the STI regions. It is rather a not ideal image that will be turned into an ideal image by the deficiencies of the method that is used to create the image. The pre-distorting of the STI profile is done to the mask and under computer control and is determined by production parameters of the projection system. Taken into account are the parameters of the projecting system that have a negative effect in the process of creating the ideal image. It must be remembered that the ideal image is the image that ultimately appears on the surface of the substrate where it is created. Any manipulation of the system that creates this ideal image is permissible as long as this manipulation is aimed at and results in correcting the ultimate image to where it equals the ideal image. Shown in FIG. 4a is a sample mask for an array of STI regions that are to be projected at the bottom of an array of STI regions. These are the profiles of a mask for the array before they are exposed by the mask and are therefore the pre-distorted arrays. Of particular note are the areas 18 of the row 20 of STI regions where each of the corners of the regions reduced in angle to compensate for the "over-profiling" of the individual STI arrays that is evident in the arrays shown in FIG. 3a. The concept of the invention can be applied in a number of different manners in pre-shaping STI arrays in response to particular deficiencies that may occur in the final STI regions that are created on the surface of a substrate. It is in this respect not difficult to accept that STI imaging systems, where they control the imaging of the STI down to the microscopic level of detail, can affect and direct this microscopic level of details as desired. Where the imaging system can contain mask data that creates a rectangle, that same imaging system can contain mask data that reflects a geometry that slightly deviates from a rectangle. The exact nature and extend of this deviation can readily be determined by trial and error for a particular imaging system. Once this is established that imaging system is now provided with the imaging data for a mask that creates the ideal STI profile under the conditions where the mask data for such a profile have been determined. Should the performance characteristics of the imaging system change, then a new set of mask data can readily be derived and be adapted to the new performance characteristics of the imaging system.

Figure 4B:
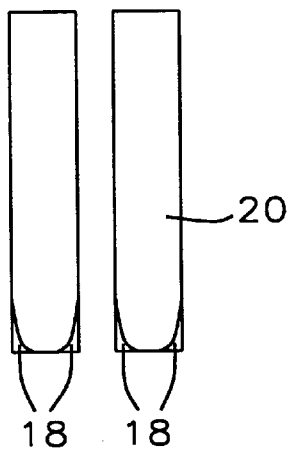

FIG. 4b shows an enlarged top view of two of the profiles of mask images for STI regions that have been pre-distorted. The image that actually is created on the surface of the substrate is an ideal profile of an exact rectangle.

The solutions of the invention that have been suggested as being implemented by data manipulation that result in changing the design of the mask that is used to create the ideal STI profile. By for instance rounding off the corners, as shown in FIG. 4, of the opening that is contained in a mask for the creation of the ideal STI profile, the rounding off of the corners of this image in the mask will suppress or eliminate the actual occurrence of image overshoot that is shown in FIG. 3.

It is clear from the above discussion and from the examples that have been shown in FIGS. 1 through 4 that a correction needs to be applied to the data that is used to create the mask that is used to create STI profiles. The invention focuses on using data manipulation to achieve this objective, the objective being to modify particular features in a design in an opposite direction thereby eliminating the expected distortion. The profile for the creation of the contours of STI areas that comes out too wide can be made to be drawn narrower than the desired width. The data that is used to create these profiles for the STI regions are kept stored in data files and can therefore be accessed and manipulated. This manipulation is formalized by the creation of an optical correction (OC) factor which is created using probability functions that relate to the Critical Dimensions (CD) of the design rules as well as to the wavelength of the exposing medium. The OPC factor also takes into account line density across the surface where the lines are created. It is for instance a well known fact that optical distortions of lines is more pronounced for lines that are in dense locations of lines as opposed to isolated or relatively isolated lines. In manipulating line density versus the critical dimensions for a pattern, three approaches are commonly followed: the CD for dense lines is increased while leaving the CD for isolated lines unchanged, the CD for dense lines is left unchanged while the CD for isolated lines is decreased or the CD for dense lines is increased while the CD for isolated lines is decreased.

Although the invention has been described and illustrated with reference to specific illustrative embodiments thereof, it is not intended that the invention be limited to those illustrative embodiments. Those skilled in the art will recognize that variations and modifications can be made without departing from the spirit of the invention. It is therefore intended to include within the invention all such variations and modifications which fall within the scope of the appended claims and equivalents thereof.

What is claimed is:

1. A method for correcting peripheral distortion effects in creating STI profiles as part of circuit patterns, comprising:
   storing a prescription of a circuit pattern in a data file that comprises Shallow Trench Isolation regions;
   modifying the data file by applying an Optical Correction to it; dividing the data file into a first and a second subfile whereby said first subfile contains data relating to Shallow Trench Isolation areas that are arranged in arrays while said second data file contains data relating to single cell Shallow Trench Isolation areas;
   modifying said first data subfile by applying a first bias to all data contained therein;
   modifying said second data subfile by applying a second bias to all data contained therein; and
   combining said first and second subfiles into a single merged data file.

2. The method of claim 1 wherein said Shallow Trench Isolation regions formed using the merged file have a critical dimension that is within 10% of a value determined by design rules.

3. The method of claim 1 wherein radiation used to form shallow Trench Isolation regions using the merged file has a wavelength of 365 nm. or 248 nm.

4. The method of claim 1 wherein said merged file is intended for use with a positive photoresist.

5. The method of claim 1 wherein said merged file is intended for use with a negative photoresist.

6. The method of claim 1 further comprising using the merged file during processing of integrated circuits.

7. The method of claim 1 wherein said first bias is determined by experiment.

8. The method of claim 1 wherein said second bias is determined by experiment.

9. A method for forming a photoresist pattern on the surface of a substrate, comprising the steps of:
   providing a semiconductor substrate;
   coating the surface of said substrate with a layer of photoresist;
   storing a description of a photoresist image in a data file that comprises Shallow Trench Isolation areas;
   modifying the data file by applying an Optical Correction to it;
   dividing the corrected file into a first and a second subfile whereby said first subfile contains data that relates to Shallow Trench Isolation areas that are arranged in arrays while said second data file contains data relating to single cell Shallow Trench Isolation areas;
   modifying said first data subfile by applying a first bias to all data contained therein;
   modifying said second data subfile by applying a second bias to all data contained therein;
   combining said first and second subfiles into a single merged data file;
   forming a photoresist mask using said merged file; exposing said layer of photoresist to radiation through said mask; and
   developing said exposed photoresist thereby forming said photoresist pattern on the surface of said substrate.

10. The method of claim 9 wherein said photoresist pattern has a critical dimension that is within 10% of a value determined by design rules.

11. The method of claim 9 wherein radiation used to expose said photoresist layer has a wavelength of 365 nm. or 248 nm.

12. The method of claim 9 wherein said photoresist is a positive photoresist.

13. The method of claim 9 wherein said photoresist a negative photoresist.

14. The method of claim 9 wherein said first bias is determined by experiment.

15. The method of claim 9 wherein said second bias is determined by experiment.

* * * * *